(12) United States Patent
Mueck et al.

(10) Patent No.: US 9,835,663 B2
(45) Date of Patent: *Dec. 5, 2017

(54) CAPACITIVE MEASUREMENT SYSTEM AND METHOD

(71) Applicant: Texas Instruments Incorporated, Dallas, TX (US)

(72) Inventors: Michael Mueck, Andover, MA (US); Ronald F. Cormier, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 726 days.

This patent is subject to a terminal disclaimer.

(21) Appl. No.: 13/718,759

(22) Filed: Dec. 18, 2012

(65) Prior Publication Data

US 2013/0106444 A1     May 2, 2013

Related U.S. Application Data

(63) Continuation of application No. 13/151,712, filed on Jun. 2, 2011, now Pat. No. 8,368,409, which is a continuation of application No. 12/381,741, filed on Mar. 16, 2009, now Pat. No. 7,982,471.

(51) Int. Cl.
| | |
|---|---|
| *G01R 27/26* | (2006.01) |
| *G01D 1/00* | (2006.01) |
| *G01D 15/00* | (2006.01) |
| *G01D 21/00* | (2006.01) |
| *G06F 3/044* | (2006.01) |

(52) U.S. Cl.
CPC ........... *G01R 27/2605* (2013.01); *G01D 1/00* (2013.01); *G01D 15/00* (2013.01); *G01D 21/00* (2013.01); *G06F 3/044* (2013.01)

(58) Field of Classification Search
CPC ...... G01R 27/2605; G01D 1/00; G01D 15/00; G01D 21/00; G06F 3/044
See application file for complete search history.

(56) References Cited

U.S. PATENT DOCUMENTS

| | | | |
|---|---|---|---|
| 4,459,541 A | 7/1984 | Fielden et al. | |
| 6,738,048 B1 * | 5/2004 | Rundel | G06F 1/3215 178/18.01 |
| 7,098,675 B2 | 8/2006 | Inaba et al. | |

(Continued)

*Primary Examiner* — Daniel Miller
(74) *Attorney, Agent, or Firm* — Gregory J. Albin; Charles A. Brill; Frank D. Cimino

(57) ABSTRACT

A capacitance measurement system precharges first terminals (21-0 . . . 21-k . . . 21-n) of a plurality of capacitors (25-0 . . . 25-k . . . 25), respectively, of a CDAC (capacitor digital-to-analog converter) (23) included in a SAR (successive approximation register) converter (17) to a first voltage ($V_{DD}$) and pre-charges a first terminal (3-j) of a capacitor ($C_{SENj}$) to a second voltage (GND). The first terminals are coupled to the first terminal of the capacitor to redistribute charges therebetween so as to generate a first voltage on the first terminals and the first terminal of the capacitor, the first voltage being representative of a capacitance of the first capacitor ($C_{SENj}$). A SAR converter converts the first voltage to a digital representation (DATA) of the capacitor. The capacitance can be a touch screen capacitance.

7 Claims, 9 Drawing Sheets

(56) References Cited

U.S. PATENT DOCUMENTS

| | | | |
|---|---|---|---|
| 7,129,714 B2 | 10/2006 | Baxter | |
| 7,205,776 B2 | 4/2007 | Kinoshita et al. | |
| 7,288,946 B2 | 10/2007 | Hargreaves et al. | |
| 7,301,350 B2 | 11/2007 | Hargreaves et al. | |
| 7,982,471 B2 * | 7/2011 | Mueck et al. | 324/686 |
| 8,125,463 B2 | 2/2012 | Hotelling et al. | |
| 2005/0083221 A1 * | 4/2005 | Seymour | H03M 1/1014 341/150 |
| 2006/0087467 A1 | 4/2006 | Itskovich | |
| 2009/0244014 A1 * | 10/2009 | Hotelling | G06F 3/0416 345/173 |

* cited by examiner

CAPACITIVE MEASUREMENT SYSTEM AND METHOD

CROSS-REFERENCE TO RELATED APPLICATIONS

This application is a continuation of U.S. patent application Ser. No. 13/151,712, entitled "CAPACITIVE MEASUREMENT SYSTEM AND METHOD," filed on Jun. 2, 2011 (now U.S. Pat. No. 8,368,409), which is a continuation of U.S. patent application Ser. No. 12/381,741, entitled "CAPACITIVE MEASUREMENT SYSTEM AND METHOD," filed Mar. 16, 2009 (now U.S. Pat. No. 7,982,471). Each of these applications is incorporated herein by reference for all purposes.

BACKGROUND OF THE INVENTION

The present invention relates generally to circuits and techniques for measurement of capacitance, and more particularly to such circuits and techniques adapted for use in touch-screen applications, touch-pad applications, and the like.

Touch screen controller circuits for use in touch screen, touch pad, and touch button applications have generally included digital controller circuitry and analog circuitry for detecting the presence of capacitance if a user touches a point on a touch screen (or a touch pad or touch button). The presence or movement of a user's finger in the vicinity of the electric field associated with the capacitance of the touch screen, touch button, etc., disturbs or impedes the electric field and therefore modifies the capacitance. The capacitance measurement circuit therefore indicates the presence of the finger as a change in the modified touchscreen or touch button capacitance. The prior art typically utilizes current sourcing/sinking circuitry, RC networks, and counters to provide a digital indication of the measured capacitance, which, in a touch screen controller, can be used to precisely identify/indicate the screen location being touched.

FIG. 1A illustrates part of a touch screen panel 1-1 which includes a suitable number of horizontal transparent conductors 2 disposed on one surface of a thin, transparent insulative layer (not shown). A suitable number of vertical transparent conductors 3 are disposed on the other surface of the insulative layer. The left end of each of the horizontal conductors 2 can be connected to suitable current sourcing or drive circuitry. The bottom end of each of the vertical conductors 3 can be connected to suitable current sinking or receiving circuitry. A cross-coupling capacitance $C_{SENj}$ occurs at an "intersection" of each horizontal conductor such as 2-I and each vertical conductor such as 3-j, the intersection being located directly beneath a "touch point" 13. Note that the touching by a user's finger does not necessarily have to occur directly over a touch point. If multiple touch points 13 are sufficiently close together, then a single touching may disrupt the electric fields of a number of different cross-coupling capacitances $C_{SENj}$. However, the largest change in the value of a particular cross-coupling capacitance $C_{SENj}$ occurs when the touching occurred directly over that particular cross-coupling capacitance.

FIG. 1B illustrates any particular horizontal conductor 2-I and any particular vertical (as in FIG. 1A) conductor 3-j and the associated cross-coupling capacitance $C_{SENj}$ between them, I and j being row and column index numbers of the horizontal conductors 2 and the vertical conductors 3, respectively. (By way of definition, the structure including the overlapping conductors 2-I and 3-j which result in the cross-coupling capacitance $C_{SENj}$ is referred to as "capacitor $C_{SENj}$". That is, the term "$C_{SENj}$" is used to refer both to the capacitor and its capacitance.)

The drive circuitry for horizontal conductor 2-I can include a drive buffer 12 which receives appropriate pulse signals on its input 4. The output of drive buffer 12 is connected to the right end of conductor 2-I, which is modeled as a series of distributed resistances RA and distributed capacitances CA each connected between ground and a node between two adjacent distributed resistances RA. The receive circuitry for conductor 3-j is illustrated as being connected to the right end of vertical conductor 3-j. A switch S1j is connected between conductor 3-j and $V_{SS}$. A sampling capacitor $C_{SAMPLE}$ has one terminal connected to conductor 3-j and another terminal connected by conductor 5 to an input of a comparator 6, one terminal of a switch S2j, and one terminal of a resistor $R_{SLOPE}$. The other terminal of switch S2j is connected to $V_{SS}$. The other terminal of resistor $R_{SLOPE}$ is connected to the output of a slope drive amplifier 9, the input of which receives a signal SLOPE DRIVE. The other input of comparator 6 is connected to $V_{SS}$. The output of comparator 6 is connected to an input of a "timer capture register" 7, which can be a counter that, together with resistor $R_{SLOPE}$ and capacitor $C_{SAMPLE}$, perform the function of generating a digital output signal on bus 14 representing the value of $C_{SENj}$.

A problem of the above described prior art is that the time required for the capacitance measurement is time-varying in the sense that a lower value of the capacitance $C_{SENj}$ requires less counting time by timer capture register 7, whereas a higher value of the capacitance $C_{SENj}$ requires more counting time by timer capture register 7. The widely variable capacitance measurement times may be inconvenient for a user. Also, the system is quite susceptible to noise because comparator 6 in Prior Art FIG. 1B is connected via $C_{SAMPLE}$ during the entire capacitance measurement process.

Thus, there is an unmet need for a capacitance measurement system that is capable of making accurate measurements of a broader range of capacitances than the prior art.

There also is an unmet need for an improved digital circuit and method for making touch screen capacitance measurements in a touchscreen controller circuit or a touch button circuit.

There also is an unmet need for a digital capacitance measurement system and method having greater capacitance measurement sensitivity than the prior art.

There also is an unmet need for a digital capacitance measurement system and method having greater capacitance per LSB measurement sensitivity than the prior art.

There also is an unmet need for a digital capacitance measurement system and method having greater touch screen capacitance per LSB measurement sensitivity than the prior art.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

SUMMARY OF THE INVENTION

It is an object of the invention to provide a capacitance measurement system that is capable of making accurate measurements of a broader range of capacitances than the prior art.

It is another object of the invention to provide an improved digital circuit and method for making touch screen capacitance measurements in a touchscreen controller circuit or a touch button circuit.

It is another object of the invention to provide a digital capacitance measurement system and method having capacitance measurement sensitivity greater than that of the prior art.

It is another object of the invention to provide a digital capacitance measurement system and method having capacitance per LSB measurement sensitivity greater than that of the prior art.

It is another object of the invention to provide a digital capacitance measurement system and method having touch screen or touch button capacitance per LSB measurement sensitivity greater than that of the prior art.

It is another object of the invention to provide a capacitance measurement system and method that are integral with and include a SAR converter.

It is another object of the invention to provide a constant-data-rate stream of touch screen panel touch point cordinate measurements or corresponding touch point capacitance measurements that do not vary with capacitance value.

Briefly described, and in accordance with one embodiment, the present invention provides a capacitance measurement system which precharges first terminals (21-0 . . . 21-k . . . 21-n) of a plurality of capacitors (25-0 . . . 25-k . . . 25), respectively, of a CDAC (capacitor digital-to-analog converter) (23) included in a SAR (successive approximation register) converter (17) to a first voltage ($V_{DD}$) and also precharges a first terminal (3-j) of a capacitor ($C_{SENj}$ or $C_{SEN}$) to a second voltage (GND). The first terminals of the CDAC capacitors are coupled to the first terminal of the capacitor to redistribute charges therebetween so as to generate a first voltage on the first terminals of the CDAC capacitors and the first terminal of the capacitor, the first voltage being representative of a capacitance of the first capacitor ($C_{SENj}$). A SAR converter converts the first voltage to a digital representation (DATA) of the capacitor. The capacitance can be a touch screen capacitance or a touch button capacitance.

In one embodiment, the invention provides a passive capacitance measurement system including a successive approximation register analog-to-digital conversion circuit (SAR ADC) (17) which includes a comparator (26). An output of the comparator (26) is coupled to an input of SAR logic and switch circuitry (28,30) which produces a digital output (DATA) on a digital bus (32). A passive network (16) for coupling a capacitor ($C_{SENj}$ in FIG. 2A or $C_{SEN}$ in FIG. 2F) to be measured to the SAR ADC (17) includes a measurement conductor (20) coupled to a first terminal (3-j) of the capacitor ($C_{SENj}$), a first switching circuit (S0, . . . Sk, . . . Sn) which is also included in the SAR ADC (17) for coupling the measurement conductor (20) to a plurality of conductors (21-0, . . . 21-k, . . . 21-n) included in both the passive network (16) and the SAR ADC (17), and a divider/CDAC (capacitor digital-to-converter) (23) which is included in both the passive network (16) and the SAR ADC (17). The divider/CDAC includes a plurality of weighted capacitors (25-0, . . . 25-k, . . . 25-n) each having a first terminal coupled to a corresponding one of the plurality of conductors (21-0, . . . 21-k, . . . 21-n), respectively, each of the weighted capacitors having a second terminal coupled by a first conductor (24) to a first input (+) of the comparator (26). The passive network (16) also includes a first switch (S6) having a first terminal coupled to the first input (−) of the comparator (26). The SAR logic and switch circuitry (28,30) is coupled to control the plurality of conductors (21-0, . . . 21-k, . . . 21) during a SAR conversion.

In a described embodiment, a second switch (S1j) selectively couples the first terminal (3-j) of the capacitor ($C_{SENj}$) to be measured to a first reference voltage (GND), and a third switch (S2j) selectively couples the first terminal (3-j) of the capacitor ($C_{SENj}$) to be measured to the measurement conductor (20). In one embodiment, the capacitor ($C_{SENj}$) to be measured is a cross-coupling capacitor (13 in FIG. 1A) formed by an intersection of first (2-I) and second (3-j) conductors of a touch screen panel (13A). In another embodiment, the capacitor ($C_{SEN}$) to be measured is a touch button capacitor (13B), the capacitor ($C_{SEN}$) to be measured having a second terminal coupled to a fixed reference voltage (GND).

In a described embodiment, the first switching circuit (S0 . . . Sk . . . Sn) includes a first group of switches (S0 . . . Sk . . . Sn) which are opened during a precharge phase to allow a second group of switches (S7k) in the SAR logic and switch circuitry (28,30) to precharge the plurality of capacitors (25-0 . . . 25-k . . . 25-n) to a predetermined precharge voltage ($V_{DD}$). The switches (S0 . . . Sk . . . Sn) of the first group are closed during a measurement phase after the precharge phase to allow redistribution of charges of the capacitor ($C_{SENj}$) to be measured to produce a measurement voltage on the measurement conductor 20 and the plurality of conductors (21-0 . . . 21-k . . . 21-n). The first group of switches (S0 . . . Sk . . . Sn) are opened during a conversion phase after the measurement phase to allow the SAR ADC (17) to successively generate bits of the digital output (DATA). In a described embodiment, the plurality of CDAC capacitors (25-0 . . . 25-k . . . 25-n) are binarily weighted.

In one embodiment, the passive capacitance measurement system includes a pump capacitor ($C_P$) coupled between the measurement conductor (20) and a predetermined low reference voltage (GND) during the precharge phase and a predetermined high reference voltage ($V_{DD}$) during the measurement phase.

In one embodiment, the passive capacitance measurement system includes auto-zeroing circuitry having an auto-zeroing switch (S3) coupled between the first input (+) of the comparator (26) and a comparator reference voltage ($V_{AZ}$) coupled to a second input (−) of the comparator (26).

In one embodiment, the passive capacitance measurement system includes a secondary passive network (16A,$C_{REF}$ in FIG. 5) having an output (24A) coupled to a second input (−) of the comparator (26), the secondary passive network (16A) being substantially similar to the passive network (16) together with the capacitor ($C_{SENj}$) to be measured.

In one embodiment, the invention provides a method for measuring a capacitance ($C_{SENj}$ in FIG. 2A, $C_{SEN}$ in FIG. 2F) of a first capacitor ($C_{SEN}$ in FIG. 2A, $C_{SEN}$ in FIG. 2F), including precharging at least one of a plurality of first terminals (21-0 . . . 21-k . . . 21-n) of a plurality of weighted CDAC capacitors (25-0 . . . 25-k . . . 25), respectively, of a CDAC (capacitor digital-to-analog converter) (23) included in a SAR (successive approximation register) converter (17) to a first reference voltage ($V_{DD}$) during a precharge phase, coupling the first terminals (21-0 . . . 21-$k$ . . . 21-$n$) of the CDAC capacitors (25-0 . . . 25-$k$ . . . 25-$n$) to a first terminal (3-$j$) of the first capacitor ($C_{SENj}$) to redistribute charges among the first capacitor ($C_{SENj}$ in FIG. 2A, $C_{SEN}$ in FIG. 2F) and at least one of the plurality of CDAC capacitors (25-0 . . . 25-$k$ . . . 25) so as to generate a first voltage on the first terminals (21-0 . . . 21-$k$ . . . 21-$n$) of the CDAC capacitors (25-0 . . . 25-$k$ . . . 25-$n$) and the first terminal (3-$j$) of the first capacitor ($C_{SENj}$) during a measurement phase, the first voltage being representative of the capacitance ($C_{SENj}$) of the first capacitor ($C_{SENj}$), and performing a successive approximation conversion operation on the first voltage to generate a digital representation (DATA) of the first capacitance ($C_{SENj}$). In a described embodiment, the method includes precharging the first terminal (3-$j$) of the first capacitor ($C_{SENj}$) to a second reference voltage (GND) during the precharging. The method includes opening a first group of switches (S0 . . . S$k$ . . . S$n$) during the precharge phase and closing at least some of the switches of a second group of switches (S7$k$) to precharge at least some of the plurality of the CDAC capacitors (25-0 . . . 25-$k$ . . . 25-$n$) to a predetermined precharge voltage (e.g., $V_{DD}$) during the precharge phase. The method includes closing the first group of switches (S0 . . . S$k$ . . . S$n$) during the measurement phase after the precharge phase to allow redistribution of charges on the first capacitor ($C_{SENj}$) to produce a measurement voltage on the first terminals (21-0 . . . 21-$k$ . . . 21-$n$) of the CDAC capacitors (25-0 . . . 25-$k$ . . . 25-$n$). The method includes opening the first group of switches (S0 . . . S$k$ . . . S$n$) during a conversion phase after the measurement phase and operating the SAR ADC (17) to successively generate bits of the digital representation (DATA) of the first capacitance ($C_{SENj}$).

In one embodiment, the method includes coupling a pump capacitor ($C_P$) between the first terminals (21-0 . . . 21-$k$ . . . 21-$n$) of the CDAC capacitors (25-0 . . . 25-$k$ . . . 25-$n$) and a predetermined low reference voltage (GND) during the precharge phase and coupling the pump capacitor ($C_P$) between the first terminals (21-0 . . . 21-$k$ . . . 21-$n$) of the CDAC capacitors (25-0 . . . 25-$k$ . . . 25-$n$) and a predetermined high reference voltage ($V_{DD}$) during the measurement phase to boost the voltage of the first terminals (21-0 . . . 21-$k$ . . . 21-$n$) of the CDAC capacitors (25-0 . . . 25-$k$ . . . 25-$n$) to improve the sensitivity of the measuring with respect to relatively high values of the capacitance ($C_{SENj}$) of the first capacitor ($C_{SENj}$).

In one embodiment, the invention provides a passive capacitance measurement system including means (30) for precharging at least one of a plurality of first terminals (21-0 . . . 21-$k$ . . . 21-$n$) of a plurality of weighted CDAC capacitors (25-0 . . . 25-$k$ . . . 25), respectively, of a CDAC (capacitor digital-to-analog converter) (23) included in a SAR (successive approximation register) converter (17) to a first reference voltage ($V_{DD}$) and means (SW for precharging a first terminal (3-$j$) of a first capacitor ($C_{SENj}$) to a second reference voltage (GND), means (S2$j$, S0 . . . S$k$ . . . S$n$) for coupling the first terminals (21-0 . . . 21-$k$ . . . 21-$n$) of the CDAC capacitors (25-0 . . . 25-$k$ . . . 25-$n$) to the first terminal (3-$j$) of the first capacitor ($C_{SENj}$) to redistribute charges among the first capacitor ($C_{SENj}$ in FIG. 2A, $C_{SEN}$ in FIG. 2F) and at least one of the plurality of CDAC capacitors (25-0 . . . 25-$k$ . . . 25) so as to generate a first voltage on the first terminals (21-0 . . . 21-$k$ . . . 21-$n$) of the CDAC capacitors (25-0 . . . 25-$k$ . . . 25-$n$) and the first terminal (3-$j$) of the first capacitor ($C_{SENj}$), the first voltage being representative of a capacitance ($C_{SENj}$) of the first capacitor ($C_{SENj}$), and means (17) for performing a successive approximation conversion operation on the first voltage to generate a digital representation (DATA) of the capacitance ($C_{SENj}$) of the first capacitor ($C_{SENj}$).

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
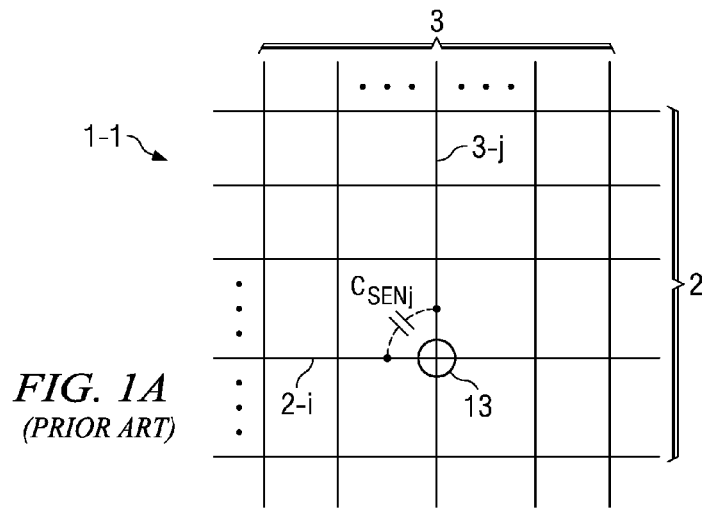
FIG. 1A illustrates a plan view diagram of upper and lower orthogonal transparent, conductive strips of a touch screen panel.

Refer now to the drawings wherein depicted elements are, for the sake of clarity, not necessarily shown to scale and wherein like or similar elements are designated by the same reference numeral through the several views.

Figure 1B:
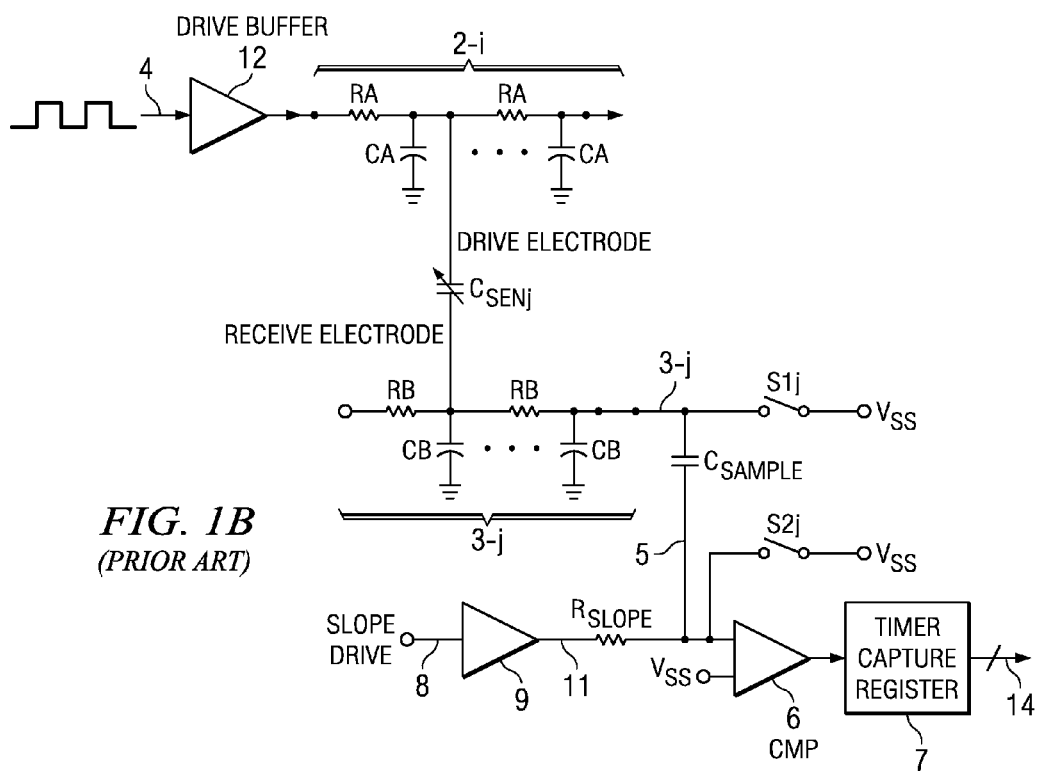
FIG. 1B is a schematic diagram representing circuitry associated with an "intersection" of a horizontal conductive, transparent strip and a vertical conductive, transparent strip of a touch screen panel, cross coupling capacitance, and circuitry for sensing the presence of a person's finger close to the intersection.
Figure 2A:
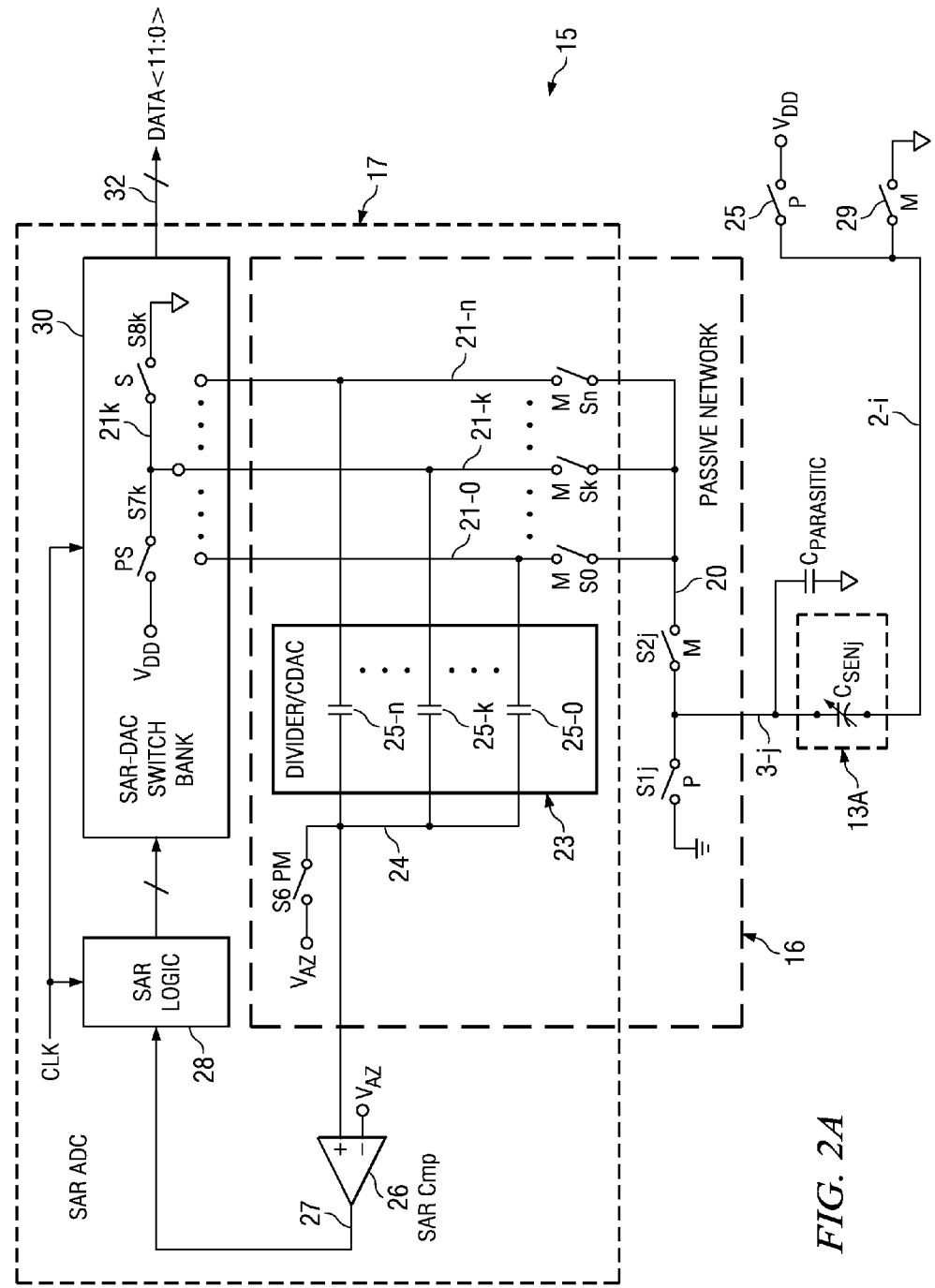
FIG. 2A is a block diagram illustrating an architecture of an embedded SAR based passive capacitance measurement system of the present invention.

FIG. 2A shows a single-ended (i.e., not differential) embodiment of an embedded SAR based passive capacitance measurement system 15 of the present invention. Capacitance measurement system 15 includes a passive network 16 and a SAR (successive approximation register) type of ADC (analog-to-digital converter) 17. Passive network 16 is coupled by conductor 3-$j$ to a touch screen capacitance $C_{SENj}$. $C_{SENj}$ can be the same as a cross-coupling capacitance of an external touchscreen panel 13A as shown in Prior Art FIGS. 1A and 1B. (Alternatively, the capacitance $C_{SENj}$ can be a capacitance $C_{SEN}$ or $C_{BUTTON}$ of a touch button with one terminal connected to ground as shown in subsequently described FIG. 2F, rather than a touchscreen panel 13A as shown in FIG. 2A.) The capacitance $C_{SENj}$ (or $C_{SEN}$) is decreased by the presence of a human finger or the like in the electric field associated with that capacitance.

In FIG. 2A, the lower left corner shows an external touch screen panel 13A. One cross-coupling capacitance $C_{SENj}$ at an intersection between a conductor 3-$j$ and a conductor 2-I of external touch screen panel 13A is illustrated, with conductor 2-I of cross-coupling capacitance $C_{SENj}$ being coupled by a switch 25 to $V_{DD}$ during the subsequently described precharge phase (P) and coupled by switch 29 to ground during the subsequently described measurement phase (M in FIG. 2B). The top terminal of capacitance $C_{SENj}$ can be coupled by conductor 3-$j$ and an optional switch S2$j$ to measurement conductor 20. (Note that optional switch S2$j$ can be replaced by connecting conductor 3-$j$ directly to measurement conductor 20 in the more common case wherein passive network 16A is multiplexed with a number of touch screen panels or a number of touch buttons.) As previously mentioned, the value of $C_{SENj}$ is affected by the touch or proximity or movement of a user's finger, depending on how close the finger approaches the intersection of conductors 2-I and 3-$j$ (as in FIGS. 1A and 1B) of touch-screen panel 13A or how close the finger approaches the $C_{SEN}$ area of touch button 13B in FIG. 2F. Various parasitic capacitances, having a total capacitance value $C_{PARASITIC}$ are in effect coupled between conductor 3-$j$ and ground, as generally shown in FIG. 2A.

Figure 2B:
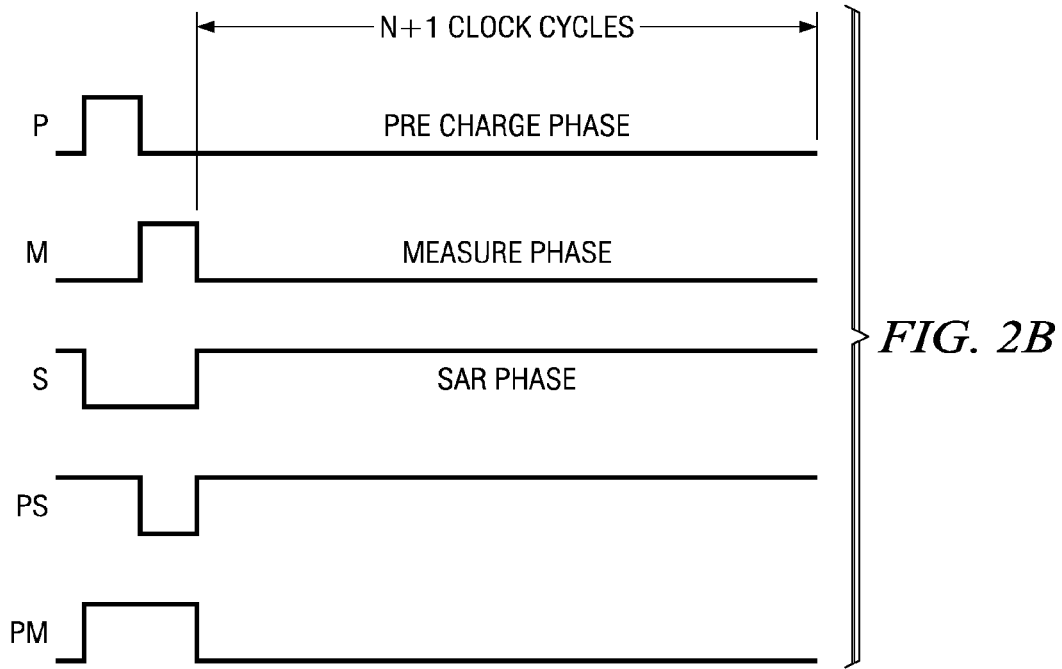
FIG. 2B is a timing diagram of clock signals used to operate the capacitance measurement system of FIG. 2A.
Figure 2F:
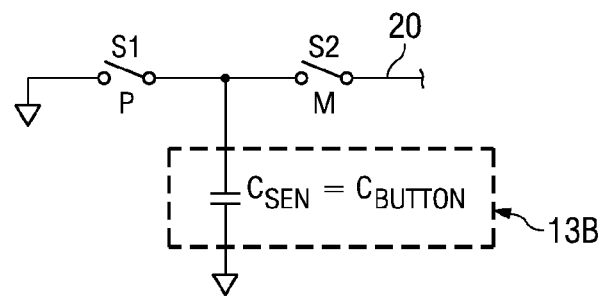
FIG. 2F is a simplified schematic diagram of a touch button circuit which can be connected to measurement conductor 20 in FIG. 2A instead of touchscreen panel 13A.

Touch screen panel 13A and switches 25 and 29 in FIG. 2A can be replaced by the illustrated touch button switch circuit shown in above mentioned FIG. 2F. Referring to FIG. 2F, the touch button switch circuit includes a touch button capacitor 13B having a capacitance $C_{SEN}$, also referred to as $C_{BUTTON}$. The lower terminal of touch button capacitor 13B is connected to a fixed reference voltage, such as ground. The upper terminal of touch button capacitor 13B is coupled by switch S1 to ground during precharge phase P and is coupled by switch S2 to measurement conductor 20 during measurement phase M.

In FIG. 2A, passive network 16 includes switch S1$j$ and optional switch S2$j$, each having a first terminal connected to conductor 3-$j$. The second terminal of switch S1$j$ is connected to ground, and the second terminal of switch S2$j$ is connected to measurement conductor 20 of passive network 16. Passive network 16 also includes switches S0 ... Sk ... Sn, each having a first terminal connected to measurement conductor 20. The second terminals of switches S0 ... Sk ... Sn are connected to CDAC bottom plate conductors 21-0 ... 21-$k$ ... 21-$n$, respectively. Passive network 16 and SAR ADC circuit 17 are connected to and disconnected from each other by the array of interface switches S0 ... Sk ... Sn switches in response to measurement phase clock signal M. A divider/CDAC (capacitor digital-to-analog converter) 23 is included in passive network 16, and includes a "top plate" conductor 24 connected to one terminal of a switch S6, the other terminal of which is connected to an auto-zeroing voltage $V_{AZ}$. Switch S6 is controlled by the signal PM in FIG. 2B. (A typical value of $V_{AZ}$ would be $V_{DD}/2$. However, $V_{AZ}$ also could be ground or $V_{DD}$, depending on how SAR comparator 26 is configured.)

Top plate conductor 24 is connected to a first terminal of each of binarily weighted capacitors 25-0 ... 25-$k$ ... 25-$n$. The second terminal of each of capacitors 25-0 ... 25-$k$ ... 25 is connected to a corresponding one of bottom plate conductors 21-0,1 ... k ... n, respectively.

SAR ADC converter 17 shares the above mentioned switches S0 ... Sk ... Sn, bottom plate conductors 21-0 ... 21-$k$ ... 21-$n$, divider/CDAC circuit 23, and switch S6 with passive network 16. SAR ADC 17 further includes an SAR comparator 26 having a (+) input connected to top plate conductor 24 and a (−) input connected to receive auto-zeroing voltage $V_{AZ}$. (Note, however, that ordinarily the input applied to the (−) input of SAR comparator 26 is the analog output of another CDAC which is either being used in a mirror or "dummy" circuit or is being used to sample ground.) Top plate conductor 24 of divider/CDAC 23, rather than the bottom plate conductors 21-0 ... 21-$k$ ... 21-$n$ thereof, preferably is connected to the (+) input of SAR comparator 26 because top plate conductor 24 typically has less parasitic capacitance. (Auto-zeroing circuitry for a SAR comparator is conventional, and can be readily implemented by those skilled in the art.) The output of SAR comparator 26 is connected by conductor 27 to the input of conventional SAR logic circuitry 28, the output bus of which is connected to the input of a conventional SAR DAC (digital-to-analog converter) switch bank circuit 30. SAR logic circuit 28 and SAR DAC switch bank 30 are clocked by a clock signal CLK.

SAR-DAC switch bank 30 includes the bank of switches S7$k$ and S8$k$ that pulls any particular CDAC capacitor to either a high level or a low level. Completion of a SAR conversion results in the final value of DATA<11:0>. SAR logic 28 performs the function of controlling the switches in SAR DAC switch bank 30. During the precharge phase, SAR-DAC switches 30 must drive the various bottom plate conductors 21-0 ... 21-$k$ ... 21-$n$ of any or all of CDAC capacitors 25-0 ... 25-$k$ ... 25-$n$, respectively, to either $V_{DD}$ or to ground. This provides an "offset" of sorts that allows for different values of voltages that may appear on measurement conductor 20 by the end of measurement phase M.

It should be understood that there are a number of choices as to how the various CDAC capacitors and measurement capacitor $C_{SENj}$ can be precharged during the precharge phase. For example, if all of the CDAC capacitors are precharged to $V_{DD}$ and the $C_{SENj}$ capacitor is precharged to ground, then, in the touch button case, the charge redistribution during the measurement phase occurs across CDAC 23, producing a particular voltage on conductor 20. Alternatively, it would be possible to precharge only half of the CDAC capacitors, or even just the MSB CDAC capacitor, to $V_{DD}$ and precharge all of the other CDAC capacitors to ground. Or, all of the CDAC capacitors could be precharged to ground and the button capacitor to could be precharged to $V_{DD}$. The results of such different precharging strategies would be that the charge redistribution during the measurement phase would advantageously result in different voltages on conductor 20.

Each of bottom plate conductors 21-0 ... 21-$k$ ... 21-$n$ is connected to a conductor 21$k$ of a corresponding switching circuit, respectively, in SAR ADC switch bank 30 which includes a pair of switches S7$k$ and S8$k$, where k is an index having a value between 0 and n. A first terminal of each of switches S7$k$ and S8$k$ of a "k"th pair has a first terminal connected to conductor 21$k$. The second terminal of each switch S7$k$ is connected to a suitable first reference voltage (such as supply voltage $V_{DD}$), and the second terminal of each switch S8$k$ is connected to a corresponding suitable second reference voltage (such as ground or $V_{SS}$). The output of SAR DAC switch bank 30 is connected to data output bus 32, on which digital data value DATA<11:0> (for a 12-bit SAR DAC) is produced. DATA<11:0)> represents the measured capacitance of $C_{SENj}$.

Note, however, that the above mentioned "suitable" corresponding reference voltages could be set to a value higher than $V_{DD}$ and a value lower than ground, respectively, or alternatively they could be set to a value less than $V_{DD}$ and a value higher than ground, respectively, in order to "squeeze" or "expand" the usable input range of SAR ADC 17. (Various implementations of SAR ADCs that execute the well known basic SAR algorithm are widely used, and can be readily implemented by those skilled in the art. For example, the assignee's TSC2007, TSC2005, TSC2003, TSC2046, ADS7846 all include similar SAR ADC circuits which could be used.)

The portion of passive capacitance measuring system 15 in FIG. 2A exclusive of touchscreen panel 13A preferably is implemented on a single integrated circuit chip. Switch S1$j$ and optional switch S2$j$, which are connected to measurement node 20, are controlled by a precharge phase clock P and a measurement phase clock M, respectively. Note that divider/CDAC 23 functions in the charge redistribution operation of passive network 16, and then functions in the SAR analog-to-digital conversion of the voltage on measurement conductor 20 into the digital output signal DATA<11:0>.

Above-mentioned FIG. 2B is a timing diagram including the digital signal P which represents the precharge phase of passive capacitance measurement system 15, the digital signal M which represents the measurement phase, and a digital signal S which represents an SAR analog-to-digital conversion phase. Timing diagram FIG. 2B also shows a digital signal PS which is the inverse of the signal M and a digital signal PM which is the inverse of the signal S. Switch S1$j$ is controlled by precharge phase signal P. Switches S2$j$ and S0 . . . Sk . . . Sn are controlled by measurement phase signal M. Switch S6 is controlled by clock signal PM, switches S7$k$ are controlled by clock signal PS, and switches S8$k$ are controlled by SAR phase clock S, where k has all of the values between 0 and n. (However, note that all of the switches in FIG. 2A are illustrated in their "open" condition.)

Figure 2C:
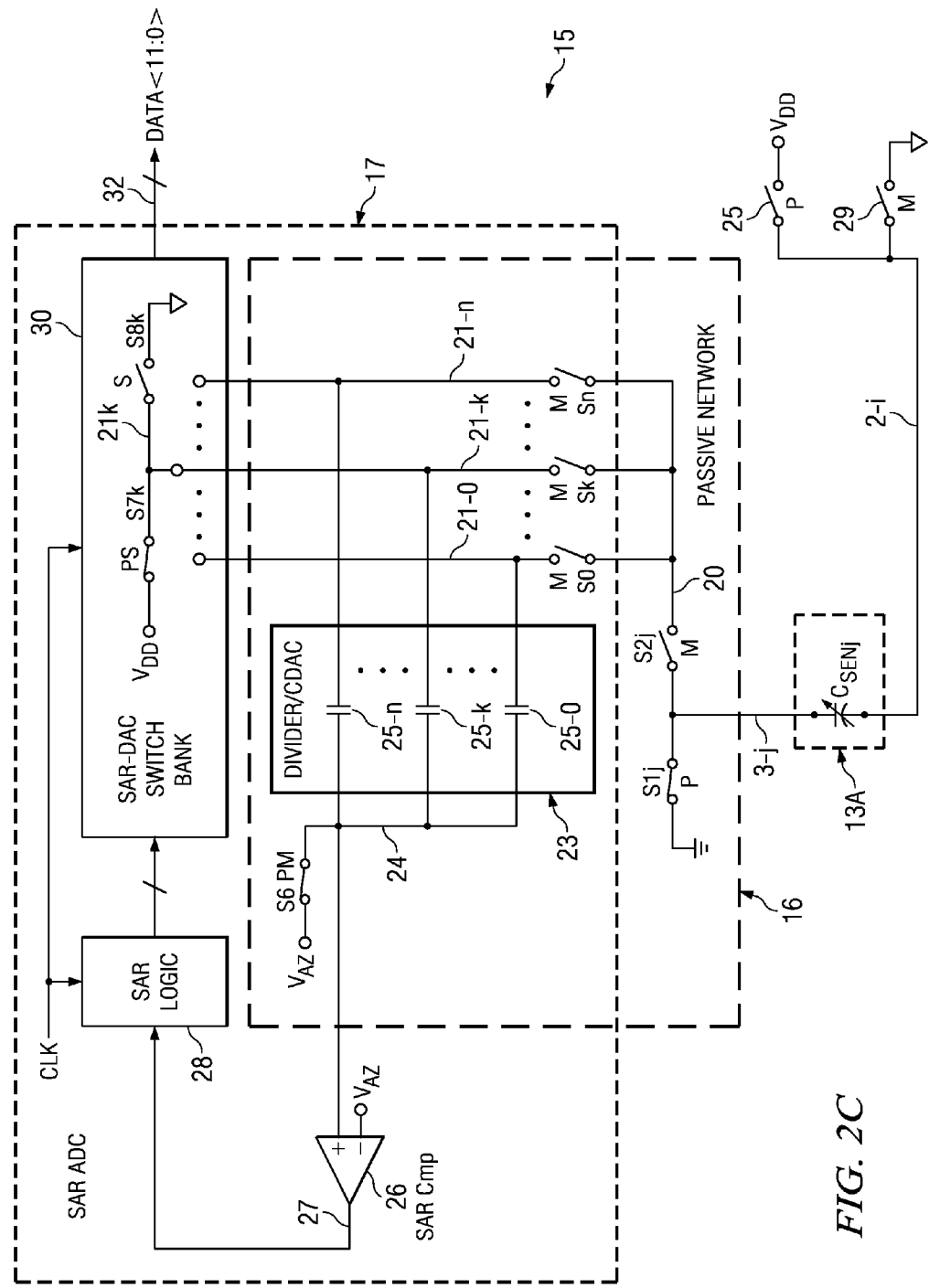
FIG. 2C is a block diagram useful in explaining operation of the capacitance measuring system of FIG. 2A during a precharge phase.

FIG. 2C shows the configuration of the various switches of passive capacitance measurement system 15 of FIG. 2A during the above mentioned precharge phase, when clock signal P is at a high level. During the precharge phase, switches S1$j$ and S6 are closed and at least some of the n+1 switches S7$k$ also are closed. The remaining switches S2$j$, S0 . . . Sk . . . Sn, and at least some of switches S8$k$ are open. In this configuration, the touchscreen capacitance $C_{SENj}$ (or touch button capacitance $C_{SEN}$) being measured is discharged to ground through switch S1$j$. The clock signal PM also is at a high level during the precharge phase, so switch S6 is also closed. Top plate conductor 24 of divider/CDAC 23 therefore is maintained at $V_{AZ}$ before the charge redistribution between $C_{SENj}$ and the capacitors of divider/CDAC 23 takes place. During a normal SAR conversion this operation (or a similar operation) would occur in conjunction with a conventional auto-zeroing of SAR comparator 26, during which SAR comparator 26 is connected to auto-zeroing voltage $V_{AZ}$.

Note that there are n+1 of the switches S7$k$ in SAR DAC control circuit 30, all controlled by the PS clock signal, which is at a high level during the precharge phase (and also during the SAR conversion phase). The n+1 switches S7$k$ therefore are closed during the precharge phase. Consequently, a first terminal of some or all (depending on the precharge strategy being used) of CDAC capacitors 25-0 . . . 25-$k$ . . . 25-$n$ in divider/CDAC circuit 23 is connected to $V_{DD}$ through its corresponding switch S7$k$, while the interface switches S0 . . . Sk . . . Sn remain open, in order to precharge the corresponding bottom plate conductors 21-0 . . . 21-$k$ . . . 21-$n$ of divider/CDAC circuit 23. By the end of the precharge phase S, the capacitance $C_{SEN}$ has been discharged and the bottom plates of capacitors 25-0 . . . 25-$k$ . . . 25-$n$ of divider/CDAC circuit 23 all have been precharged to a suitable reference voltage level, such as $V_{DD}$ or even a voltage generated by a variable gain amplifier circuit or a charge pump circuit. There also are n+1 of switches S8$k$ in SAR ADC switch bank 30 which are controlled in accordance with the conventional SAR conversion algorithm executed by SAR logic 28 and SAR ADC control circuit 30.

Figure 2D:
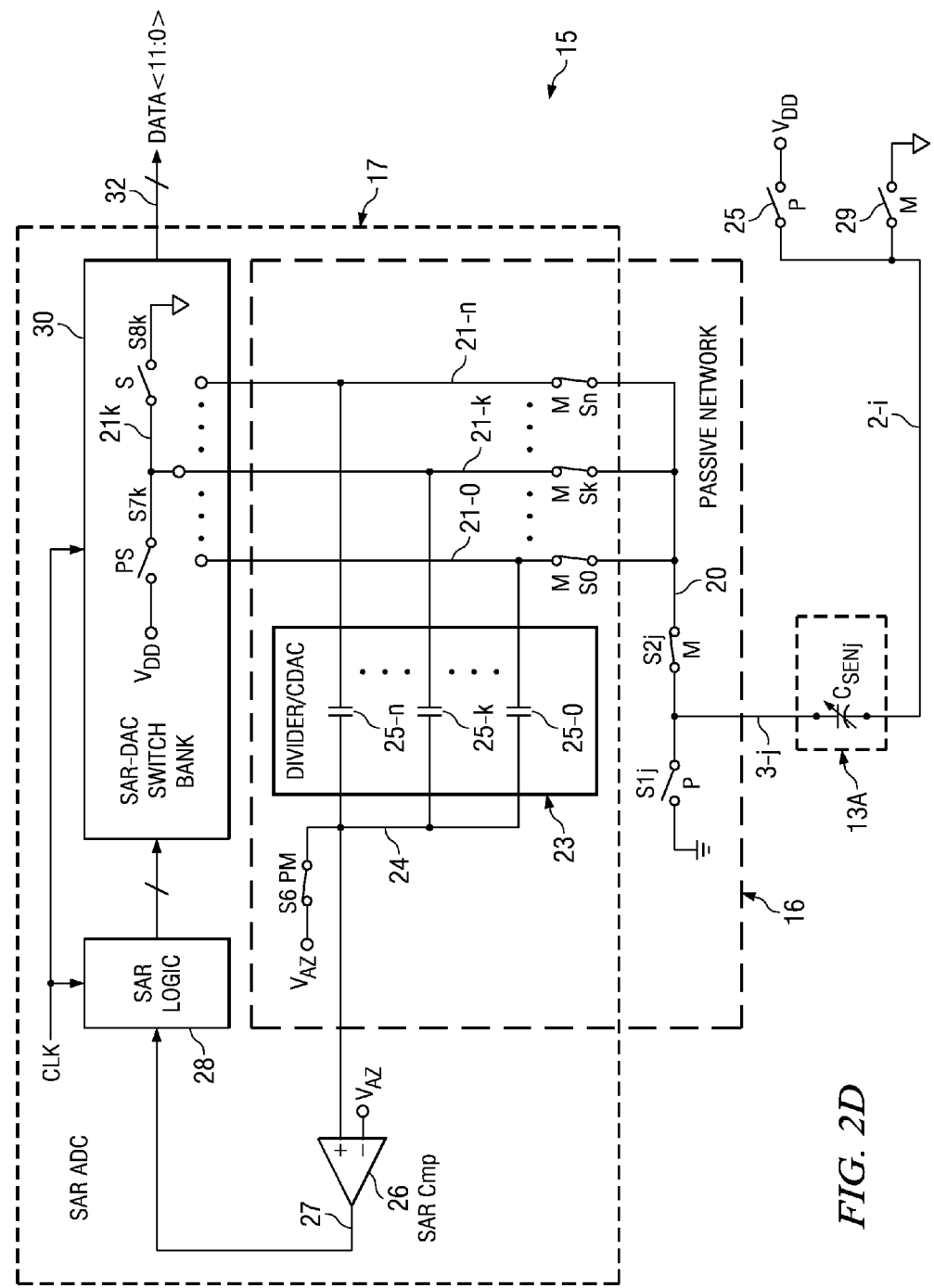
FIG. 2D is a block diagram useful in explaining operation of the capacitance measuring system of FIG. 2A during a measurement phase.

FIG. 2D shows the configuration of the various switches of capacitance measurement system 15 of FIG. 2A during the measurement phase, while clock signal M is at its high level as indicated in FIG. 2B. During the measurement phase, switches S2$j$, S0 . . . Sk . . . Sn, and S6 are closed, and the remaining switches S1$j$, S7$k$, and at least some of switches S8$k$ remain open (k being the above mentioned index variable having values between 0 and n). Conductor 3-$j$ has been released from ground since the end of precharge phase P, and M-controlled switch S2$j$ is closed. Some or all of the bottom plate conductors 21-0 . . . 21-$k$ . . . 21-$n$ of divider/CDAC 23 (depending on the precharge strategy being used) have been precharged through switches S7$k$ to a suitable reference voltage, for example, $V_{DD}$, and then disconnected therefrom. When the array of M-controlled switches S0 . . . Sk . . . Sn connecting measurement conductor 20 to the precharged bottom plate conductors 21-0 . . . 21-$k$ . . . 21-$n$ of divider/CDAC 23 are closed, the charges produced during the precharge phase on $C_{SENj}$ and at least some of CDAC capacitors 25-0 . . . 25-$k$ . . . 25-$n$ is redistributed among those capacitors. That results in a corresponding change in the voltage on measurement conductor 20 and CDAC conductors 21-0 . . . 21-$k$ . . . 21-$n$. (Note that although the auto-zeroing operation continues so that at this point the voltage on the (+) input of SAR comparator 26 has not changed, the auto-zeroing of SAR comparator 26 does not necessarily have to continue during the capacitance measurement phase. Auto-zeroing is not even essential to all embodiments of the present invention.)

It should be appreciated that depending on the expected value of $C_{SENj}$, it might be desirable to not connect all of the CDAC capacitors into the foregoing capacitive divider configuration during the measurement phase. For example, only the MSB CDAC capacitor might be included in the divider configuration. Alternatively, the bottom plate conductors 21-0 . . . 21-$k$ . . . 21-$n$ being referred to could have been set to some other suitable reference voltage between $V_{DD}$ and ground. For example, the CDAC bottom plate conductors 21-0 . . . 21-$k$ . . . 21-$n$ could have been precharged to zero and $C_{SENj}$ could be precharged to $V_{DD}$ for the measurement phase, again depending on the precharging strategy being used. This might even be necessary, depending on the ratio of the total CDAC capacitances and $C_{SENj}$.)

In operation during measurement phase M, some or all of CDAC capacitors 25-0 . . . 25-$k$ . . . 25-$n$ are used in a capacitive divider configuration. Since $C_{SENj}$ is connected in series with the CDAC capacitance $C_{CDAC}$ of some or all of CDAC capacitors 25-0 . . . 25-$k$ . . . 25, the charge redistribution results in a "divided" voltage which appears on measurement conductor 20, since during the measurement phase, the voltage of top plate conductor 24 is fixed at $V_{DD}/2$ (because switch S6 is closed). The divided-voltage output on conductor 20 is equal to $V_{DD}*CDAC/(C_t)$. So at the conclusion of the measurement phase, it is as if a voltage sampled onto conductor 20 is, in effect, sampled onto the CDAC capacitors. Then conductor 20 is disconnected by switches S0 . . . Sk . . . Sn, and the SAR conversion operation can then begin. (During the SAR operation, with switch S6 open, the voltage of conductor 20 increases and/or decreases as the successive approximation algorithm is executed.)

As an extreme or limiting example, if $C_{SENj}$ is zero, then $V_{DD}$ appears on CDAC capacitance $C_{CDAC}$ and therefore appears as the voltage on conductor 20, and hence also on bottom plate conductors 21-0 . . . 21-k . . . 21-n of CDAC 23. The voltage across CDAC 23 would be $V_{DD}*C_{CDAC}/C_t$-$V_{DD}/2$. As another example, if $C_{SENj}$ is equal to $C_{CDAC}$, then there would be $V_{DD}/2$-$V_{DD}/2$=0 volts across CDAC 23. (And the subsequent SAR conversion operation would generate a middle code 011111111111.)

Figure 3:
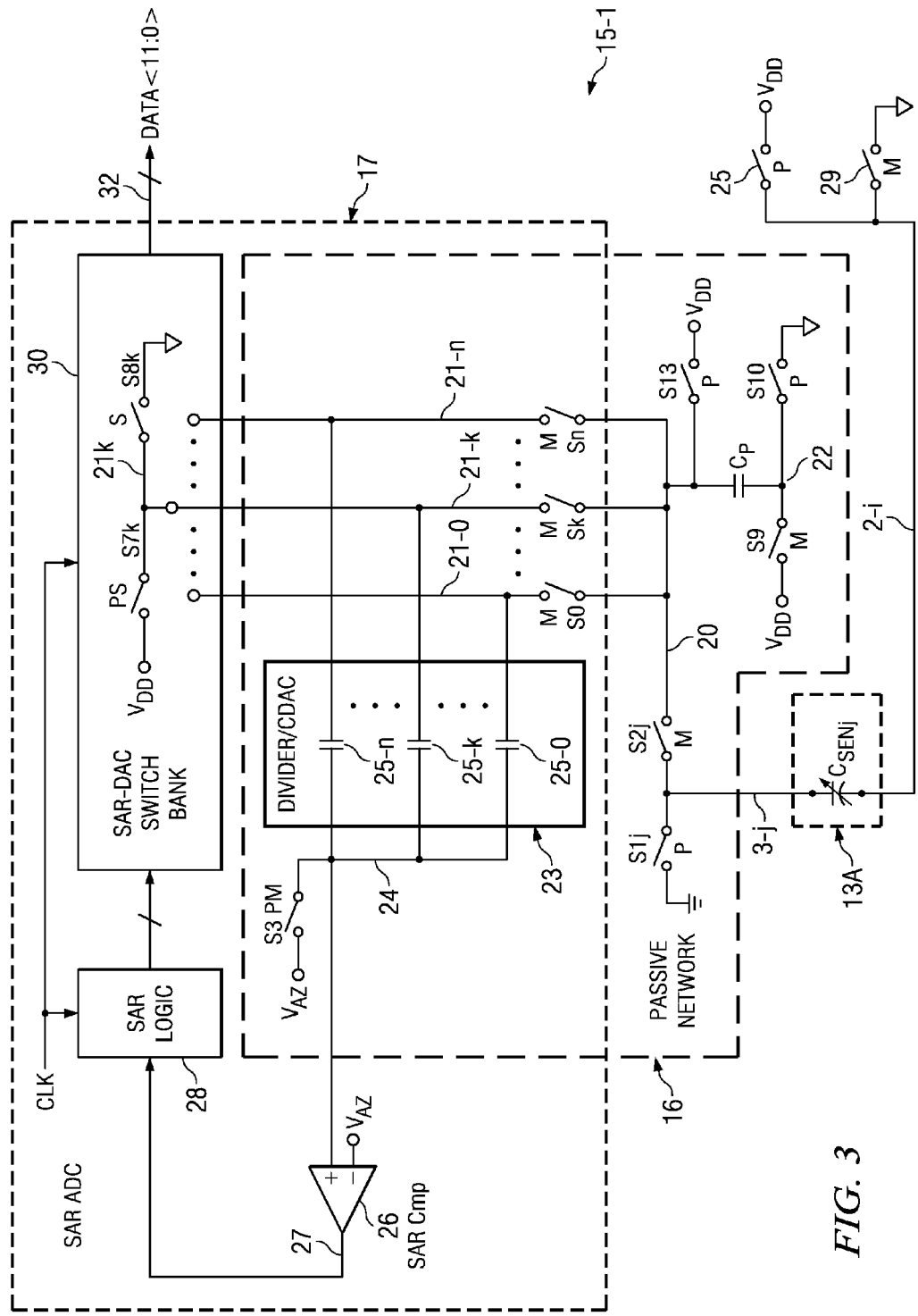
FIG. 3 is a block diagram illustrating a charge pump enhanced embedded SAR based passive capacitance measurement system of the present invention.

As another extreme or limiting example, if $C_{SENj}$ is very large, then, as above, the voltage on top plate conductor 24 is fixed, and the voltage on $C_{SENj}$ is sampled onto the bottom plate conductors 21-0 . . . 21-k . . . 21-n of the CDAC capacitors 25-0 . . . 25-k . . . 25-n through switches S0 . . . Sk . . . Sn and conductor 20, and hence the voltage sampled onto bottom plate conductors 21-0 . . . 21-k . . . 21-n would be zero, to subsequently be converted by SAR ADC 17. Of course, the determination of the voltages on conductor 20 and hence on bottom plate conductors 25-0 . . . 25-k . . . 25-n becomes more complicated if parasitic capacitances are considered and also if subsequently described charge pump capacitor $C_P$ in FIG. 3 is included.

Figure 2E:
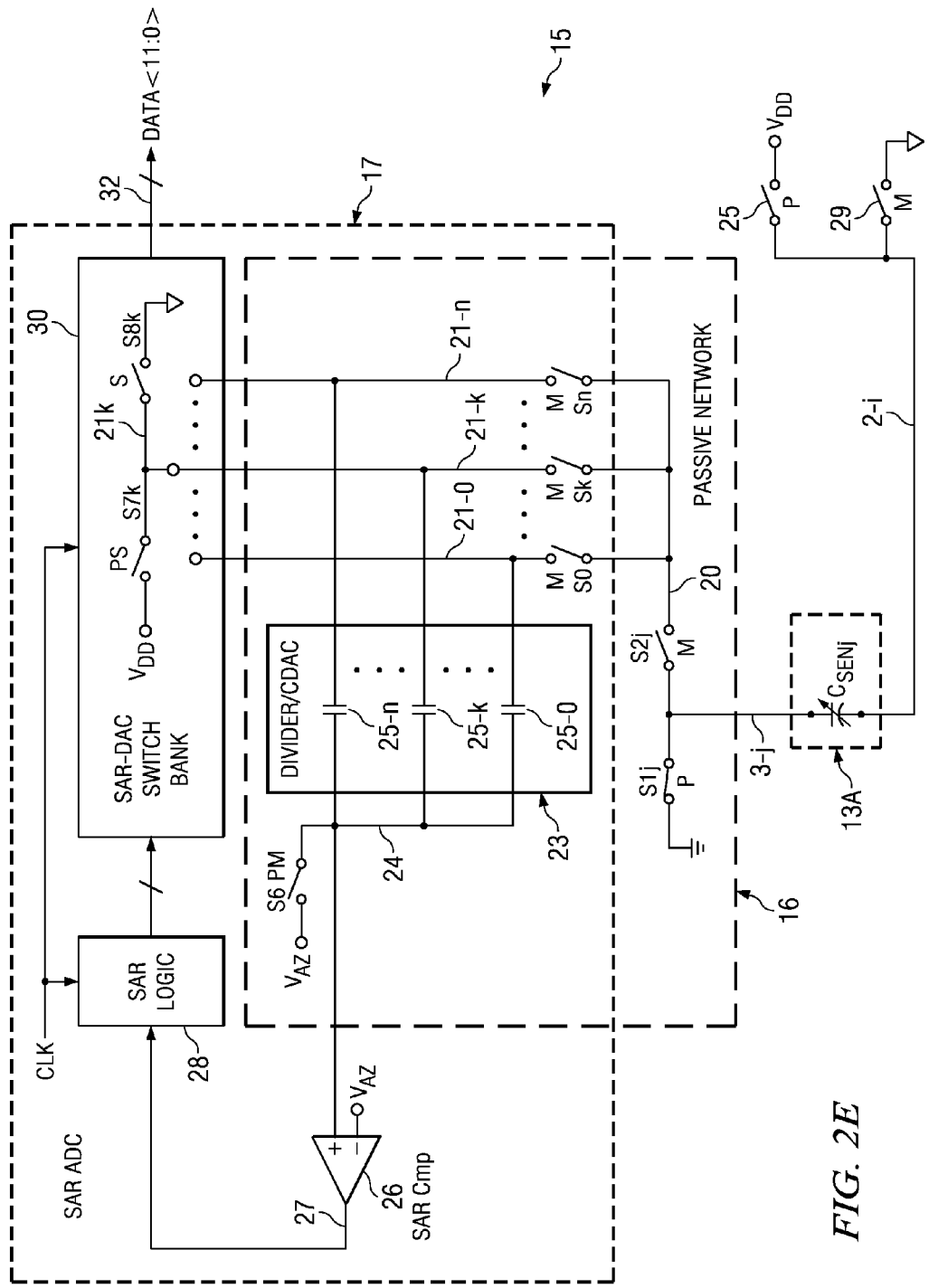
FIG. 2E is a block diagram useful in explaining operation of the capacitance measuring system of FIG. 2A during a SAR analog-to-digital conversion phase.

FIG. 2E shows the configuration of the various switches of capacitance measurement system 15 of FIG. 2A during the SAR analog-to-conversion phase, when clock signals S and PS are at a high level and clock signals P, M, and PM are at a low level as indicated in FIG. 2B. During the SAR analog-to-digital conversion phase, switch S1j is closed and switches S2j, S0 . . . Sk . . . Sn, and S6 remain open. Switches S7k and S8k are controlled by SAR logic 28 in accordance with the above mentioned well known SAR conversion algorithm so as to cause SAR comparator 26 to test, bit by bit, the voltages produced on top plate conductor 24 as the bottom plates of the CDAC capacitors 25-0 . . . 25-k . . . 25-n, starting with the voltage on MSB CDAC capacitor 25-0, are sequentially connected to $V_{DD}$ by the corresponding switches S7k (the index variable k having the values 0-n) as the bottom plates of the other CDAC capacitors are connected to ground through their corresponding switches S8k. (Since the M-controlled switches S0 . . . Sk . . . Sn are open, measurement conductor 20 may be electrically floating during the SAR conversion phase, although as a practical matter it may be set to a fixed reference voltage.)

Once measurement phase clock M is "de-asserted" to its low level, the measurement phase operation is complete and the SAR conversion phase can begin. For the 12-bit case in which n=11, switches S0 . . . Sk . . . S11 and switch S6 are opened, and the sampling of $C_{SENj}$ by passive network 16 has been completed. SAR DAC switch bank 30 contains a total of 24 switches, in pairs. The bottom plate conductor of each CDAC capacitor, for example, the MSB CDAC capacitor 25-0) can be pulled to $V_{DD}$ by a corresponding one of switches S7k, or can be pulled to ground by a corresponding one of switches S8k of the same pair. (Of course, the two corresponding capacitors of a "k"th pair are never simultaneously asserted, i.e., one is never couples to $V_{DD}$ while the other couples to ground.) For example, during the SAR conversion phase, the MSB capacitor 25-0 first is pulled to $V_{DD}$ by switch S7-0 (i.e., switch S7k where k=0) and then top plate conductor 24 is compared to $V_{AZ}$ and all of the other less significant CDAC capacitors are pulled to ground by the appropriate S7k switches. If testing of the resulting voltage on top plate conductor 24 by SAR comparator 26 determines that the voltage on top plate conductor 24 is too high, then the corresponding MSB capacitor (not shown) is pulled to ground by switch S8-0 (i.e., switch S8k where k=0), and all of the other less significant CDAC capacitors are pulled to $V_{DD}$ by the appropriate S7k switches. Then the next-most-significant (MSB-1) capacitor 25-1 is pulled to $V_{DD}$ and the voltage on top plate conductor 24 is tested. Essentially the same procedure is successively repeated for all of the less significant bits.

Execution of the SAR ADC algorithm results in the digital output DATA<11:0> for the case in which n=11. DATA<11:0> indicates the amount of charge redistributed due to a person's finger touching or being in the vicinity of touch point 13 (see FIG. 1A) of touchscreen panel 13A. Once the SAR conversion is complete, the 12 bits of data (for this example) generated by SAR DAC control circuit 30 represent the value of the voltage on measurement conductor 20 immediately after the charge redistribution is complete. In a touchscreen controller, the digital output data DATA<11:0> can be readily used to determine the location of the particular touch point 13 on touchscreen panel 13A that has been touched by the finger of a user.

At the end of the SAR testing process, an output voltage appears on top plate conductor 24 that is equal to $V_{AZ}$, and the n+1 logical levels (i.e., 12 logic levels for the case where n=11) representing whether the various bottom plate conductors 21-0,1 . . . 11 were at "0" or "1" levels after the corresponding decisions by SAR comparator 26 provide the digital output value DATA<11:0> representing the final voltage of top plate conductor 24.

A shortcoming of passive capacitance measurement system 15 as shown in FIG. 2A is that it has a somewhat limited range of useful values of $C_{SENj}$. Another shortcoming of passive capacitance measurement system 15 is that it is subject to sensitivity degradations as $C_{SENj}$ or the total capacitance on measurement conductor 20 becomes too large. The embodiment of the invention generally as shown in FIG. 2A can measure a value of $C_{SENj}$ in the range from 0 pF (picofarads) to a value which is a function of desired system accuracy/performance, e.g., roughly 30 pF. However, it would be desirable for some applications, to provide improved a passive capacitance measurement system having greater sensitivity, i.e., greater measured capacitance per LSB of DATA<11:0> than can be achieved using the system shown in FIG. 2A.

FIG. 3 shows a modified embedded SAR based passive capacitance measurement system 15-1 which includes the circuitry shown in FIG. 2A and further includes a charge pump network including a pump capacitor $C_P$ having one terminal connected either directly or by a M-controlled switch (not shown) to measurement conductor 20 and another terminal connected by conductor 22 to one terminal of each of switches S9j and S10j. A P-controlled switch S13 is coupled between measurement conductor 20 and $V_{DD}$. The other terminal of M-controlled switch S9j is connected to $V_{DD}$, and the other terminal of P-controlled switch S10j is connected to ground. During the previously described precharge phase P, pump capacitor $C_P$ is discharged through switch S10j to ground. During the previously described measurement phase, pump capacitor $C_P$ is coupled to $V_{DD}$, thereby "pumping" the voltage on measurement conductor 20 to a significantly higher voltage than $V_{DD}$ before the previously described charge redistribution occurs.

Figure 4A:
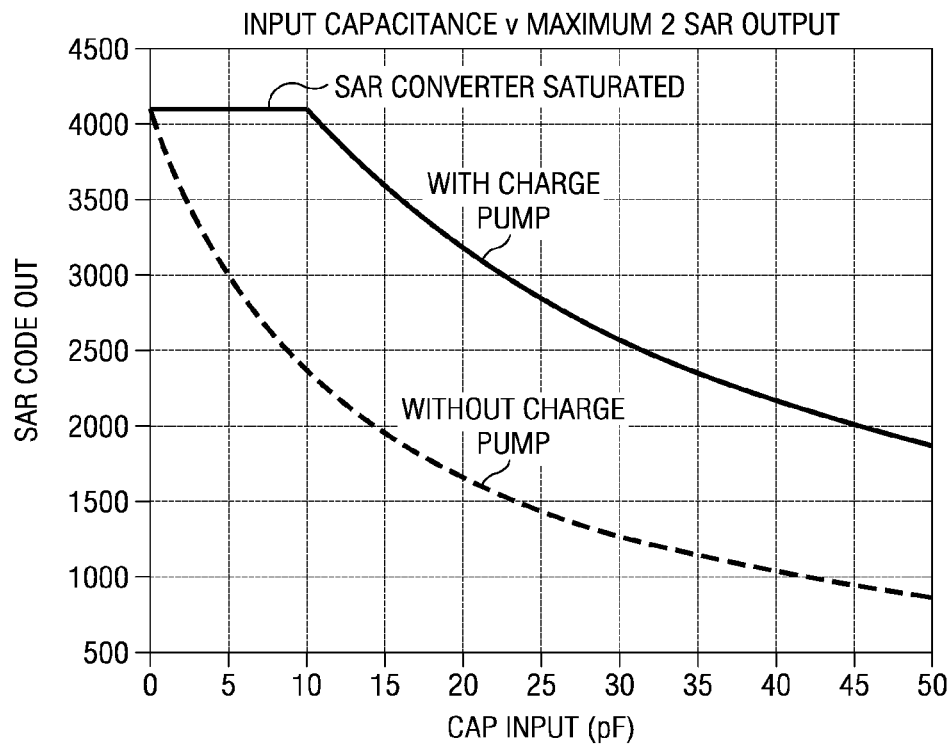
FIG. 4A is a graph which shows digital values of capacitance measured by the capacitance measurement systems of FIGS. 2A and 3.

FIG. 4A illustrates capacitance measurement sensitivity, i.e., SAR code output versus $C_{SENj}$ without the pump capacitor $C_P$, as the lower curve. The upper curve in FIG. 4A indicates the higher capacitance measurement sensitivity for the embodiment of FIG. 3, using pump capacitor $C_P$. Using pump capacitor $C_P$ allows lower capacitance measurements to be made which result in voltage values on measurement conductor 20 that are above voltage measurement capability of the SAR converter 17. That is, using pump capacitor $C_P$ has the effect of boosting or pumping the voltage on measurement conductor 20 to levels greater than $V_{DD}$.

For small values of $C_{SENj}$, is not desirable to use charge pump capacitor $C_P$ because the slope of the lower curve in FIG. 4A is adequate. As the value of $C_{SENj}$ increases, it may be necessary to increase the slope, which is proportional to the "sensitivity" of the passive capacitance measurement system 15 of FIG. 2A. To "broaden" the steep part of the slope for larger values of $C_{SENj}$, charge pump capacitor $C_P$ is used to cause saturation of SAR ADC 17 at small values of $C_{SENj}$, and also increase the overall slope magnitude in order to "recover" a bit of the foregoing higher sensitivity for larger values of $C_{SENj}$.

Figure 4B:
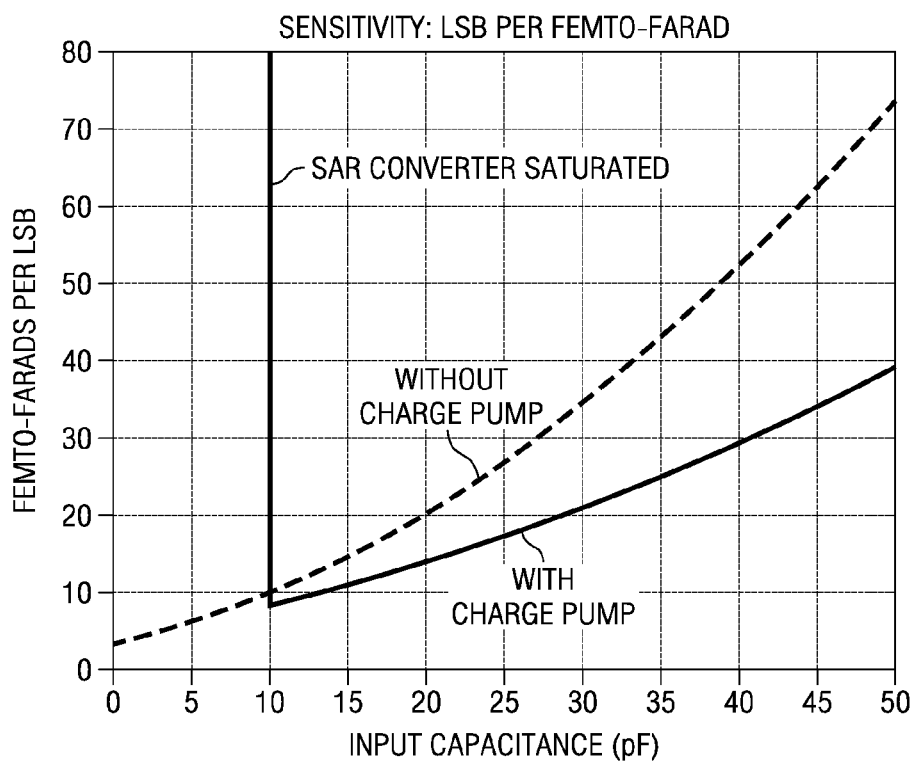
FIG. 4B is a graph which shows measurement sensitivity of the capacitance measurement systems of FIGS. 2A and 3.

FIG. 4B shows another way of representing essentially the same information as in FIG. 4A, but in terms of femptofarads per LSB. This better illustrates how many femptofarads which $C_{SENj}$ needs to change in order to cause a 1-LSB change in DATA<11:0>. The upper curve in FIG. 4B indicates capacitance measurement sensitivity of the system shown in FIG. 2A. The lower curve in FIG. 4B indicates capacitance measurement sensitivity of the system shown in FIG. 3, including charge pump capacitor $C_P$, and shows that the charge pump implementation of the invention improves its capacitance measurement sensitivity. If charge pump capacitor $C_P$ is used, and if $C_{SENj}$ is too small, then the voltage on measurement conductor 20 will go higher than $V_{DD}$, causing the SAR-ADC converter 17 to become saturated to $V_{DD}$. This causes the lower curve in FIG. 4B to have the vertical straight line, and also causes the upper curve in FIG. 4A to have the horizontal upper segment. (Note that it would also be possible to configure the circuitry shown in FIG. 3 in such a way that the SAR converter would be saturated to ground rather than to $V_{DD}$.)

Figure 5:
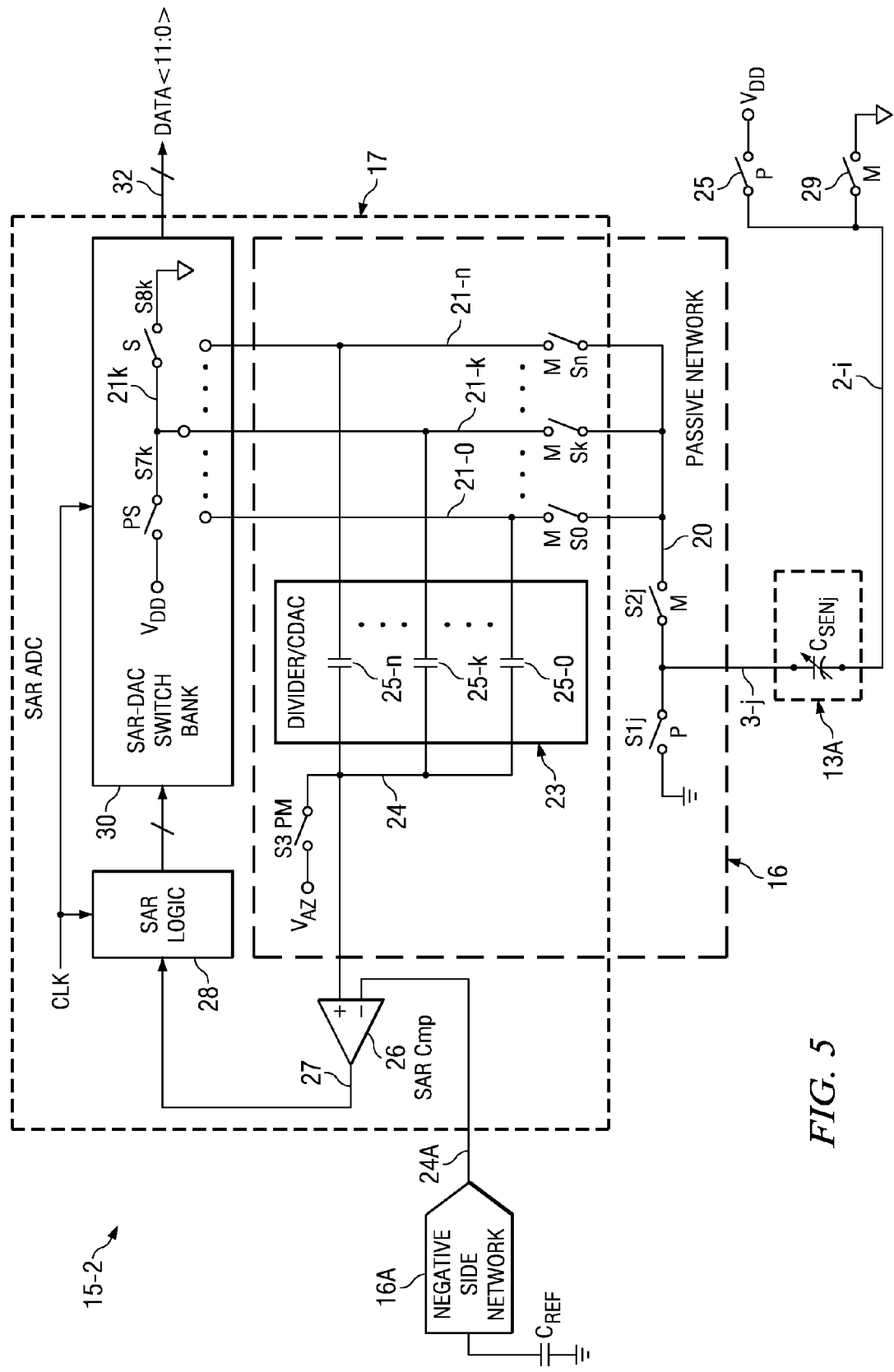
FIG. 5 is a block diagram of a differential implementation of the capacitance measurement system of FIG. 2A.

FIG. 5 shows a capacitance measurement system 15-2 which includes all of the circuitry 15-1 shown in FIG. 2A, and further includes a "negative side network" 16A and a reference capacitor $C_{REF}$. Negative side network 16A (together with reference capacitor $C_{REF}$), constitute a network that is very similar to the network including passive network 16 and capacitance $C_{SENj}$. The output 24A of negative side network 16A is connected to the (−) input of SAR comparator 26. The capacitance of reference capacitor $C_{REF}$ is essentially the same as $C_{SENj}$, and negative side network 16A is operated simultaneously with the network including passive network 16 and SAR ADC 17 such that corresponding parasitic-based switching offset voltages are canceled, and such that the charge injection in each of the two networks is common mode and therefore is canceled.

Although negative side network 16A can be considered to be a "dummy" network to achieve the foregoing cancellations, it also can be used to compare $C_{SENj}$ to $C_{REF}$. For example, if one of $C_{SENj}$ and $C_{REF}$ is larger than the other, then the digital output DATA<11:0> is either larger or smaller than its midrange value. A single clock SAR operation can be performed to determine which is larger, and then the rest of the SAR ADC conversion process can be completed to determine the magnitude of the difference between $C_{SENj}$ and $C_{REF}$.

In the above described embodiments of the invention, the capacitor $C_{SENj}$ is sampled, and then the decision by SAR comparator 26 is made while the touch screen panel capacitance $C_{SENj}$ is decoupled from SAR ADC 17. This results in substantially improved noise performance and more accurate capacitance measurement values, which it is believed will be an important issue to potential users of the invention.

The advantages of the described embodiments of the invention include much higher speed operation than the prior art, along with reduced power dissipation and improved immunity to printed circuit board noise. The described embodiments of the invention provide consistent times to generate DATA<11:0)> for a sample capacitance measurement, in contrast to the prior art in which the amount of time required for capacitance measurement is quite dependent on the amount of the capacitance to be measured. Less noise is introduced into the described embodiments of the invention because, for example, in a 12 bit SAR ADC implementation the touch screen panel is sampled only once, for 2 μs (microseconds), during each 15 μs cycle time and then is effectively disconnected by opening switches S0 ... Sk ... Sn. Only about 15 clock cycles, i.e., 50 μs at 1 MHZ, is required for a capacitance measurement, which is many fewer clock cycles than for the prior art. Since $C_{SENj}$ is only coupled to SAR ADC 17 for only a small fraction of the total cycle operation and then is disconnected, SAR ADC 17 is not affected as much by circuit noise as the prior art, in which the capacitance to be sampled is connected for the entire measurement cycle. The architecture is easily multiplexed for multiple channels, e.g. 8 channels per network. The described embodiments of the invention are easily reconfigurable to allow them to be used as a typical analog-to-digital converter. The capacitance measurement circuit of the present invention therefore can be utilized both as a touch-screen controller and as a fully functional analog-to-digital converter.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the CDAC capacitors in divider/CDAC 23 do not have to be waited binarily. Furthermore, various known capacitive divider arrangements other than the one illustrated can be used, for example to provide cancellation of common mode errors due to mismatching of circuit elements and mismatching of parasitic elements. It should be appreciated that although the CDAC capacitors are binarily weighted in the described embodiments, they could be weighted in other ways, for example in accordance with a thermometer code. A "capacitively divided voltage" on measurement conductor 20 could also be achieved during the measurement phase by grounding the bottom plate conductors 21-0 ... 21-$k$ ... 21-$n$ and precharging top plate conductor 24 to an arbitrary voltage.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

What is claimed is:

1. An apparatus comprising:
   a capacitive touch screen panel; and
   a touch screen controller having:
   a capacitor circuit that includes a plurality of weighted capacitors that are coupled to each other at a node;
   a first switching circuit that includes a first terminal coupled to the capacitive touch screen panel, a second terminal coupled to a reference voltage terminal, a set of terminals coupled to a first set of conductors of the capacitor circuit, and a switch coupled between the first and second terminals;
   a comparator that is coupled to at least a second conductor of the capacitor circuit, each of the weighted capacitors of the capacitor circuit being coupled between the comparator and a respective terminal of the set of terminals;
   a second switching circuit that is coupled to the first set of conductors of the capacitor circuit; and
   successive approximation register (SAR) logic that is coupled to the comparator and is configured to control the second switching circuit.

2. The apparatus of claim 1,
   wherein the capacitive touch screen panel includes a cross-coupling capacitance that occurs at an intersection of a first conductor and a second conductor of the capacitive touch screen panel, and
   wherein the first switching circuit is coupled between one of the first and second conductors of the capacitive touch screen panel and the capacitor circuit.

3. The apparatus of claim 2, wherein the touch screen controller further includes a charge pump coupled to the one of the first and second conductors.

4. The apparatus of claim 1, wherein the touch screen controller further includes a charge pump coupled to the first switching circuit.

5. An apparatus comprising:
   a capacitive touch screen panel having a plurality of horizontal conductors and a plurality of vertical conductors; and
   a touch screen controller having:
   a capacitor circuit that includes a plurality of weighted capacitors that are coupled to each other at a node;
   a switching circuit that includes a first terminal coupled to one of the horizontal or vertical conductors of the capacitive touch screen panel, a second terminal coupled to a reference voltage terminal, a set of terminals coupled to a set of conductors of the capacitor circuit, and a switch coupled between the first and second terminals; and
   a comparator that is coupled to the capacitor circuit, each of the weighted capacitors of the capacitor circuit being coupled between the comparator and a respective terminal of the set of terminals.

6. The apparatus of claim 5, wherein the switching circuit includes:
   a first switch having a first terminal coupled to the one of the horizontal or vertical conductors of the capacitive touch screen panel, and a second terminal coupled to a first conductor in the set of conductors of the capacitor circuit; and
   a second switch having a first terminal coupled to the one of the horizontal or vertical conductors of the capacitive touch screen panel, and a second terminal coupled to a second conductor in the set of conductors of the capacitor circuit.

7. The apparatus of claim 5, wherein the touch screen controller further includes a charge pump coupled to the switching circuit.

* * * * *